United States Patent
Wu et al.

(10) Patent No.: US 10,229,999 B2
(45) Date of Patent: Mar. 12, 2019

(54) METHODS OF FORMING UPPER SOURCE/DRAIN REGIONS ON A VERTICAL TRANSISTOR DEVICE

(71) Applicant: GLOBALFOUNDRIES Inc., Grand Cayman (KY)

(72) Inventors: Xusheng Wu, Ballston Lake, NY (US); John Zhang, Altamont, NY (US); Haigou Huang, Rexford, NY (US); Jiehui Shu, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/445,392

(22) Filed: Feb. 28, 2017

(65) Prior Publication Data

US 2018/0248046 A1    Aug. 30, 2018

(51) Int. Cl.
*H01L 29/786* (2006.01)
*H01L 29/66* (2006.01)
(Continued)

(52) U.S. Cl.
CPC .. *H01L 29/78618* (2013.01); *H01L 21/02532* (2013.01); *H01L 29/42392* (2013.01); *H01L 29/66666* (2013.01); *H01L 29/7827* (2013.01); *H01L 29/78642* (2013.01); *H01L 29/78684* (2013.01)

(58) Field of Classification Search
CPC ......... H01L 29/42392; H01L 29/66666; H01L 29/78642
See application file for complete search history.

(56) References Cited

U.S. PATENT DOCUMENTS 5,342,797 A    8/1994   Sapp et al.
5,414,289 A    5/1995   Fitch et al.
(Continued)

OTHER PUBLICATIONS

Final Office Action from related U.S. Appl. No. 15/268,751 dated May 18, 2018.
(Continued)

*Primary Examiner* — Marcos D Pizarro Crespo
*Assistant Examiner* — Shannon G Yi
(74) *Attorney, Agent, or Firm* — Amerson Law Firm, PLLC

(57) ABSTRACT

A plurality of vertically oriented channel semiconductor structures is formed above a substrate. A bottom source/drain (S/D) region is formed proximate a lower portion of the vertically oriented channel semiconductor structure. A first dielectric layer is formed above the vertically oriented channel semiconductor structure. A thickness of the first dielectric layer is reduced to expose an upper portion of the vertically oriented channel semiconductor structure. A first semiconductor material region is formed on the exposed upper portion. The thickness of the first dielectric layer is further reduced to expose a channel portion of the vertically oriented channel semiconductor structure and to define a bottom spacer adjacent the bottom S/D region. A gate structure is formed around the channel region of the vertically oriented channel semiconductor structure. A second semiconductor material region is formed on the upper portion to define an upper S/D region after forming the gate structure.

4 Claims, 4 Drawing Sheets

(51) Int. Cl.
*H01L 21/02* (2006.01)
*H01L 29/423* (2006.01)
*H01L 29/78* (2006.01)

(56) References Cited

U.S. PATENT DOCUMENTS

| | | | |
|---|---|---|---|
| 6,372,559 B1 | 4/2002 | Crowder et al. |
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |
| 7,465,622 B2 | 12/2008 | Lin |
| 7,666,733 B2 | 2/2010 | Delconibus |
| 7,700,432 B2 | 4/2010 | Chaudhry et al. |
| 8,637,849 B2 | 1/2014 | Deligianni et al. |
| 9,177,785 B1 | 11/2015 | Kelly et al. |
| 9,224,840 B2 | 12/2015 | Flachowsky et al. |
| 9,278,362 B2 | 3/2016 | Basu et al. |
| 9,385,195 B1 | 7/2016 | Zhang |
| 9,530,863 B1 | 12/2016 | Zhang et al. |
| 9,530,866 B1 | 12/2016 | Zhang et al. |
| 9,640,636 B1 | 5/2017 | Bentley et al. |
| 9,660,028 B1 | 5/2017 | Cheng et al. |
| 9,812,443 B1 * | 11/2017 | Cheng ............... H01L 27/0629 |
| 2003/0047749 A1 | 3/2003 | Chaudhry et al. |
| 2003/0119237 A1 | 6/2003 | Chittipeddi et al. |
| 2007/0111414 A1 | 5/2007 | Chaudhry et al. |
| 2008/0054350 A1 | 3/2008 | Breitwisch et al. |
| 2009/0085088 A1 | 4/2009 | Takaishi |
| 2010/0171163 A1 | 7/2010 | Kim et al. |
| 2011/0253981 A1 | 10/2011 | Rooyackers et al. |
| 2013/0341270 A1 | 12/2013 | Kar et al. |
| 2014/0353593 A1 | 12/2014 | Smets |
| 2015/0091100 A1 | 4/2015 | Xie et al. |
| 2015/0137271 A1 | 5/2015 | Cai et al. |
| 2016/0005850 A1 | 1/2016 | Zhao et al. |
| 2016/0284712 A1 | 9/2016 | Liaw |
| 2016/0365456 A1 * | 12/2016 | Liu ..................... H01L 29/7883 |
| 2017/0229472 A1 | 8/2017 | Lu et al. |
| 2017/0338334 A1 | 11/2017 | Cheng et al. |

OTHER PUBLICATIONS

Office Action from related U.S. Appl. No. 15/268,796 dated Jan. 12, 2018.

Notice of Allowance from related U.S. Appl. No. 15/132,383 dated Jul. 21, 2017.

Hergenrother et al., "The Vertical Replacement-Gate (VRG) MOSFET: A 50-nm Vertical MOSFET with Lithography-Independent Gate Length," IEDM 99-75, IEEE 1999.

* cited by examiner

METHODS OF FORMING UPPER SOURCE/DRAIN REGIONS ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming upper source/drain regions on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12. As indicated in the right-hand portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B, and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. The formation of vertical transistor devices can present some special challenges. For example, the upper S/D region 18 is typically formed by epitaxially growing material using the top surface of the fin as a seed layer. The small upper surface area of the fin makes this growth process difficult.

The present disclosure is directed to methods of forming upper source/drain regions on a vertical transistor device that may solve or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming upper source/drain regions on a vertical transistor device. One illustrative method disclosed herein includes, among other things, forming a plurality of vertically oriented channel semiconductor structures above a substrate. A bottom source/drain (S/D) region is formed proximate a lower portion of the vertically oriented channel semiconductor structure. A first dielectric layer is formed above the vertically oriented channel semiconductor structure. A thickness of the first dielectric layer is reduced to expose an upper portion of the vertically oriented channel semiconductor structure. A first semiconductor material region is formed on the exposed upper portion. The thickness of the first dielectric layer is further reduced after forming the first semiconductor material region to expose a channel portion of the vertically oriented channel semiconductor structure and to define a bottom spacer adjacent the bottom S/D region. A gate structure is formed around the channel region of the vertically oriented channel semiconductor structure. A second semiconductor material region is formed on the upper portion to define an upper S/D region after forming the gate structure.

Another illustrative method disclosed herein includes, among other things, forming a fin above a substrate. A hard mask layer is disposed on an upper surface of the fin. A bottom source/drain (S/D) region is formed proximate a lower portion of the fin. A first dielectric layer is formed above the fin and the hard mask layer. A thickness of the first dielectric layer is reduced to expose an upper portion of the fin. A first semiconductor material region is formed on the exposed upper portion proximate the hard mask layer. The thickness of the first dielectric layer is further reduced after forming the first semiconductor material region to expose a channel portion of the fin and to define a bottom spacer adjacent the bottom S/D region. A gate structure is formed around the channel portion. A second semiconductor material region is formed on the upper surface of the fin to define an upper S/D region after forming the gate structure.

An illustrative device disclosed herein includes, among other things, a vertically oriented channel semiconductor structure defined above a substrate. A bottom source/drain (S/D) region is defined proximate a lower portion of the vertically oriented channel semiconductor structure. A bottom spacer of dielectric material is positioned on a bottom portion of the vertically oriented channel semiconductor structure. A gate structure is positioned around a channel portion of the vertically oriented channel semiconductor structure. A top S/D region is defined on an upper surface of the fin. A first width of the fin in an upper portion immediately below the top S/D region is greater than a second width of the fin immediately below the upper portion.

BRIEF DESCRIPTION OF THE DRAWINGS

The disclosure may be understood by reference to the following description taken in conjunction with the accompanying drawings, in which like reference numerals identify like elements, and in which.

Figure 1:
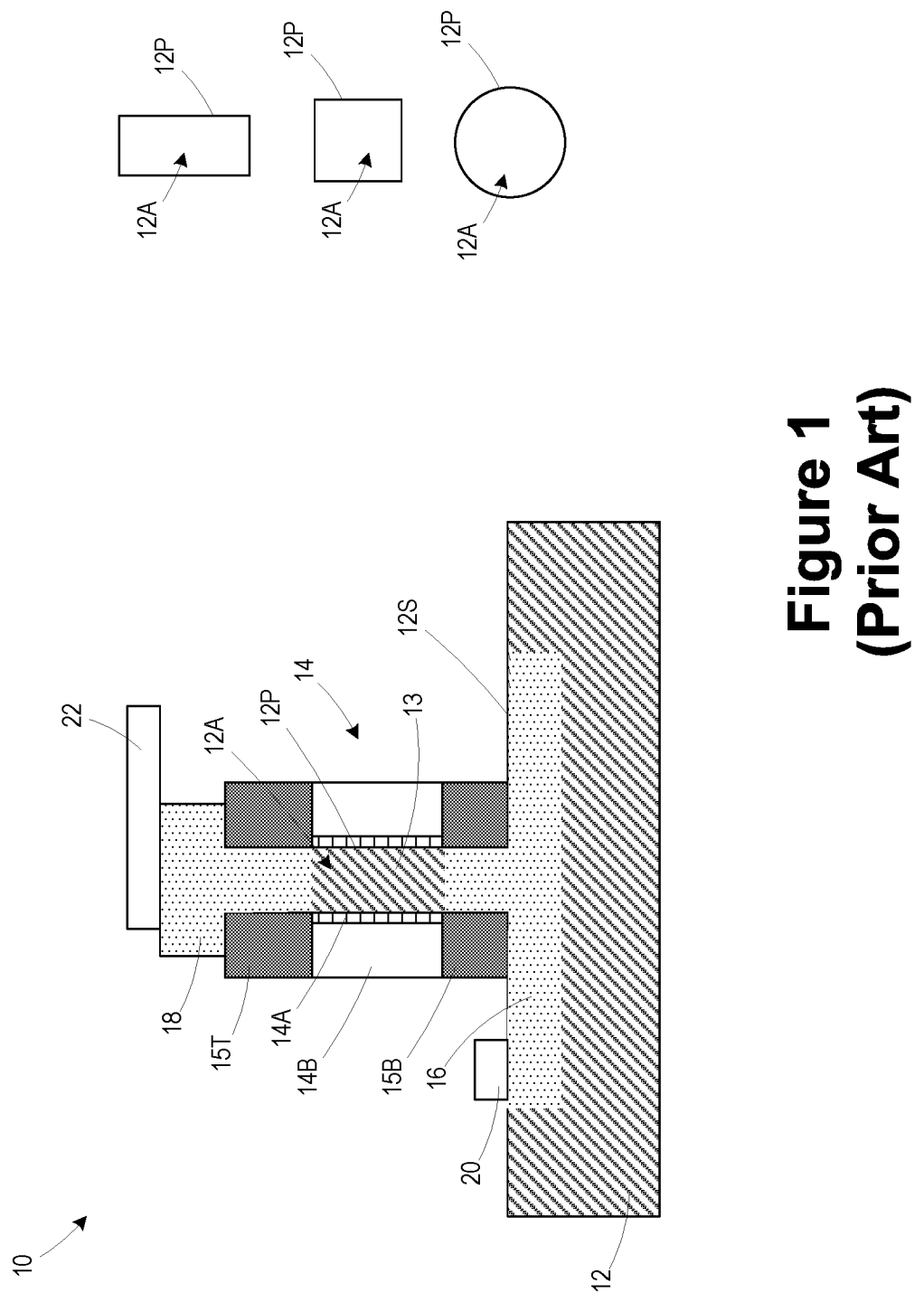
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2B:
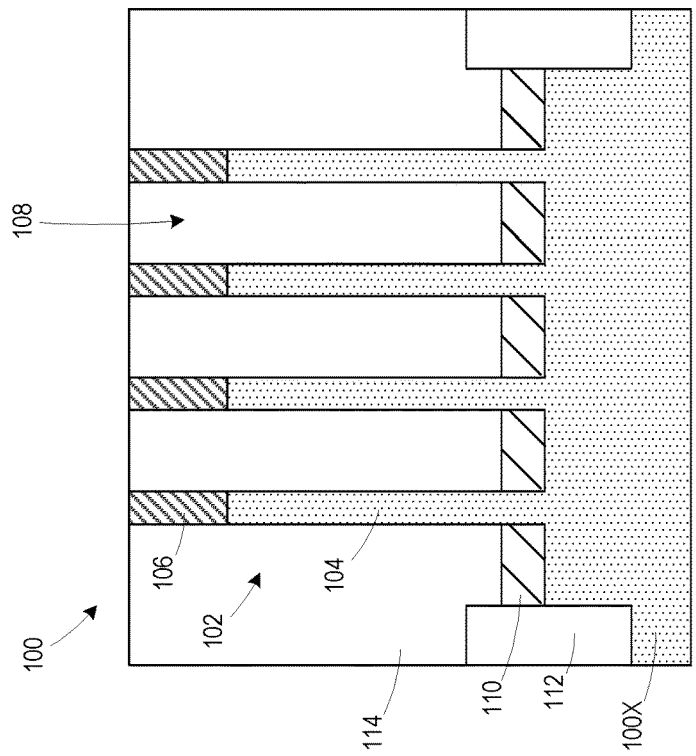
FIGS. 2A-2F depict various illustrative novel methods disclosed herein for simultaneously forming upper source/drain regions on a vertical transistor device.
Figure 2A:
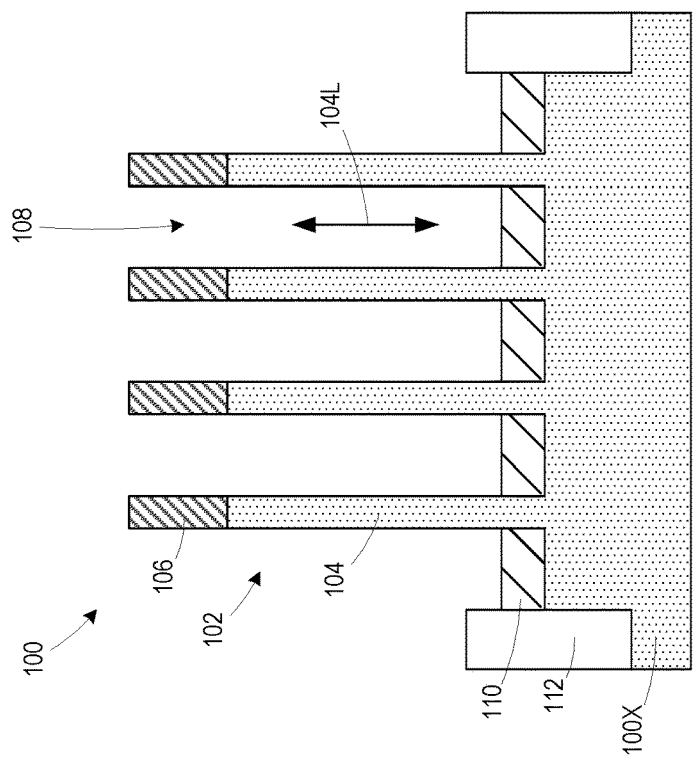

FIGS. 2A-2F depict various illustrative novel methods of forming upper source/drain regions on a vertical transistor device of an integrated circuit (IC) product 100 that includes a plurality of illustrative vertical transistor devices 102 each including a vertically-oriented channel semiconductor structure 104. Of course, the IC product 100 may typically include millions of such vertical transistor devices 102. In the illustrated examples, the vertical transistor devices have a rectangular cross section when viewed from above (e.g., fin-type devices). In other embodiments, the vertical transistor devices 102 may have different cross section shapes, such as circle, oval, square, etc. (as depicted in the prior art structure 10 of FIG. 1). During operation, current will flow through the vertically oriented channel semiconductor structure 104 of the vertical transistor device 102 in the direction indicated by the double arrows 104L, which is the gate length direction of the device 102. FIG. 2A represents a cross-sectional view taken through a subset of the vertical transistor devices 102 in a direction perpendicular to a long axis of the vertical transistor devices 102.

FIG. 2A depicts one illustrative embodiment of the IC product 100 including the vertical transistor devices 102 disclosed herein at a stage of fabrication after several process operations have already been performed. In general, the IC product 100 is formed in and above a substrate 100X. The substrate 100X may have a variety of configurations, such as a bulk semiconductor (e.g., silicon) configuration. The substrate 100X may have a bulk configuration (as depicted) or a semiconductor-on-insulator (SOI) or a silicon-on-insulator configuration that includes a bulk semiconductor layer, a buried insulation layer (e.g., silicon dioxide), and an active layer (e.g., silicon), wherein semiconductor devices are formed in and above the active layer. The substrate 100X may be made of silicon or it may be made of materials other than silicon. Thus, the terms "substrate" or "semiconductor substrate" should be understood to cover all semiconducting materials and all forms of such materials.

With continuing reference to FIG. 2A, the vertically oriented channel semiconductor structures 104 have been formed for the vertical transistor devices 102. In the depicted example, the vertically oriented channel semiconductor structures 104 were formed by performing one or more etching processes through a patterned hard mask 106 (e.g., silicon nitride) so as to define a plurality of trenches 108 in the substrate 100X. In some embodiments, the patterned hard mask 106 may be comprised of one or more layers of material and it may be formed by forming one or more layers of material and thereafter patterning those materials using known photolithography and etching techniques. In one illustrative embodiment, the patterned hard mask 106 may be comprised of a layer of silicon dioxide and a layer of silicon nitride (not separately shown).

Next, in one illustrative embodiment, an ion implantation process was performed to form a bottom source/drain (S/D) region or structure 110 for the devices 102 in the substrate 100X. The bottom source/drain (S/D) region 110 may be doped with an appropriate dopant (e.g., N-type or P-type) depending upon the type of device 102 under construction. In some applications and process flows, the bottom source/drain (S/D) region 110 may be made of the same semiconductor material as that of the substrate 100X, or it may be made of a semiconductor material that is different than that of the substrate 100X. Then, isolation trenches 112 that extend into the substrate 100X were defined by performing an etching process through a patterned etch mask (not shown), e.g., a patterned layer of photoresist material. The patterned etch mask was then removed. Although the bottom S/D regions 110 are shown as separate regions, in some embodiments, a continuous structure may be provided.

FIG. 2B illustrates the product 100 after a deposition process was performed to form a dielectric layer 114 (e.g., silicon dioxide, a low-k material, or an ultralow-k material) in the trenches and extending above the devices 102 and a planarization process was performed to expose the hard mask 106.

Figure 2D:
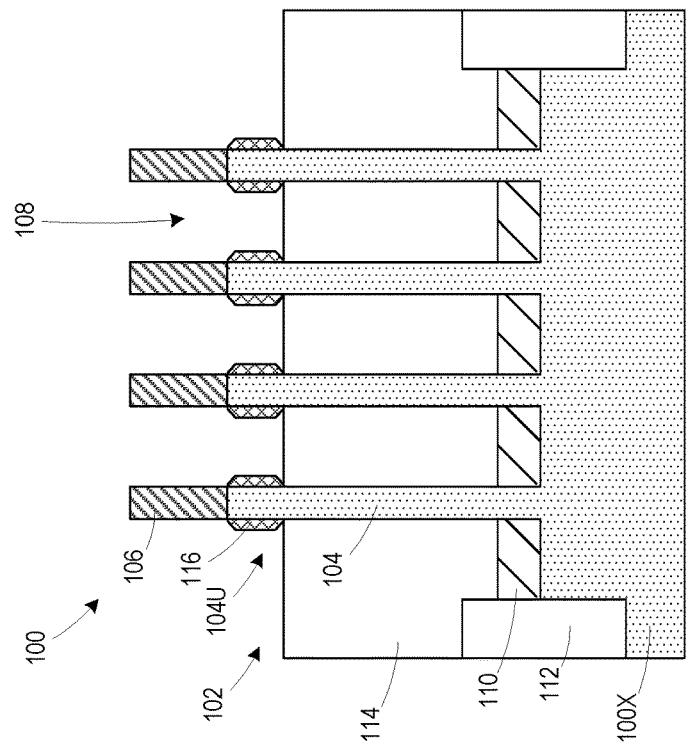
Figure 2C:
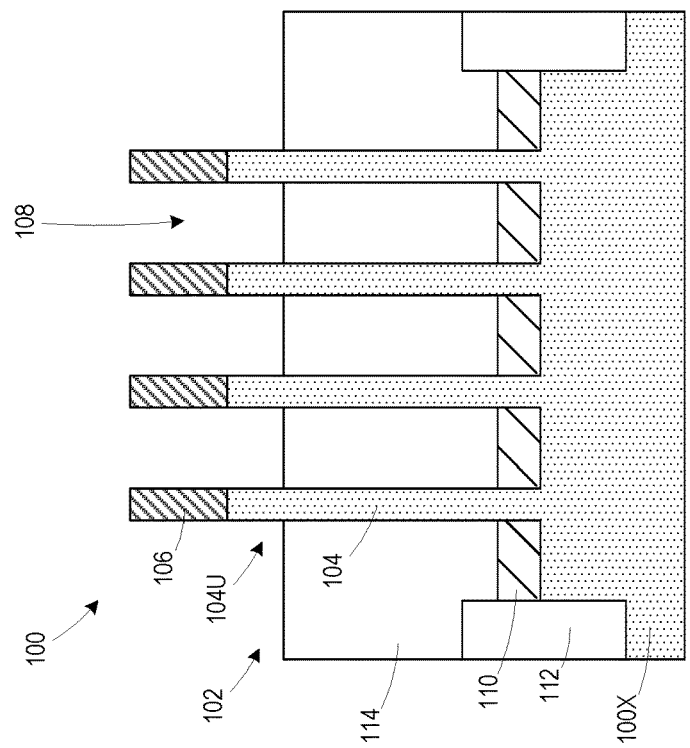

FIG. 2C illustrates the product 100 after an etch process was performed to recess the dielectric layer 114 and expose upper portions 104U of the vertically oriented channel semiconductor structures 104. In some embodiments, a liner (e.g., silicon nitride—not shown) may be provided over the vertically oriented channel semiconductor structures 104 prior to forming the dielectric layer 114. In such embodiments, a selective etch process may be employed to remove the liner on the exposed upper portions 104U.

FIG. 2D illustrates the product 100 after an epitaxial growth process was performed to define epitaxial regions 116 (e.g., undoped Si or SiGe) on the exposed upper surfaces 104U of the vertically oriented channel semiconductor structures 104. The epitaxial regions 116 increase the critical dimension (CD) or width of the upper portions 104U.

Figure 2F:
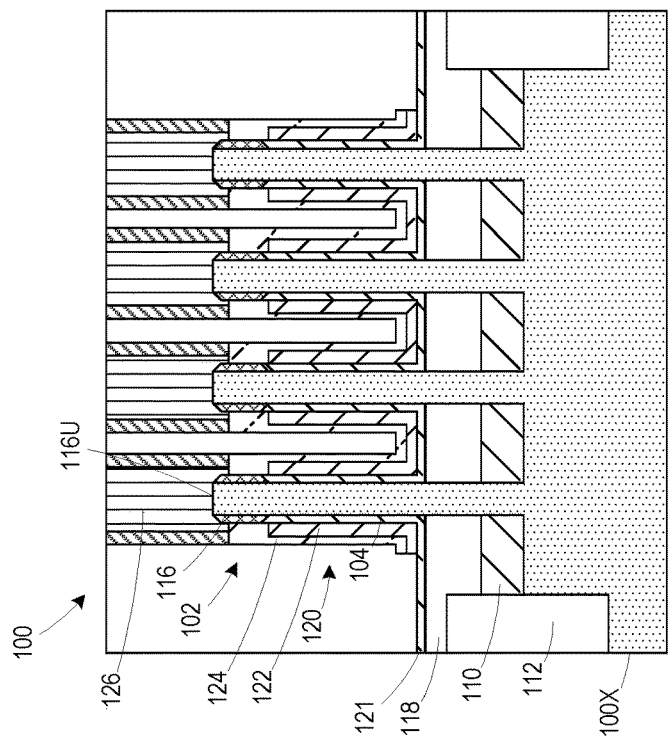
Figure 2E:
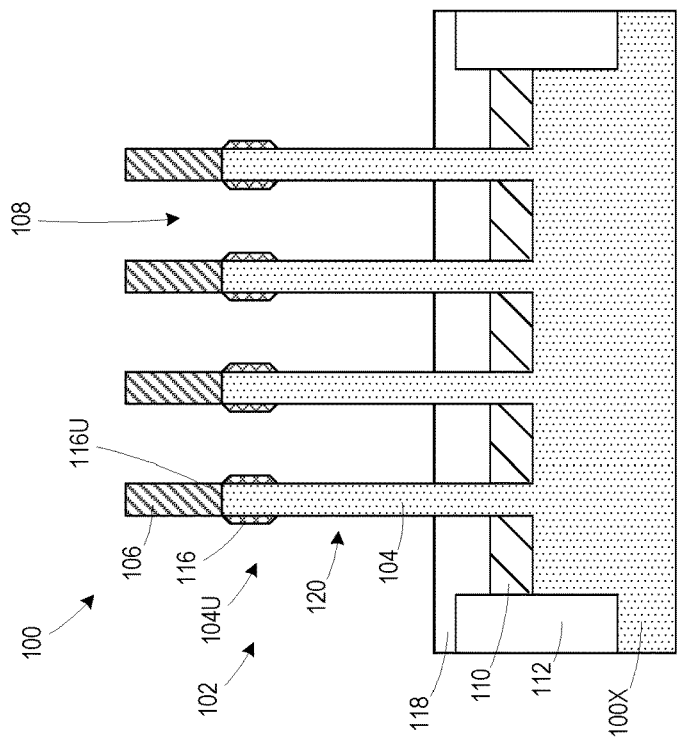

FIG. 2E illustrates the product 100 after an etch process was performed to further recess the dielectric layer 114 to reveal the vertically oriented channel semiconductor structures 104 and to define a bottom spacer 118 between the bottom S/D region 110 and a channel region 120 defined in the vertically oriented channel semiconductor structures 104. During the etch back process, portions of the epitaxial regions 116 may be eroded due to imperfect etch selectivity. However, the epitaxial regions 116 provide a buffer protecting the CD of the vertically oriented channel semiconductor structures 104 at an upper surface 116U for subsequent processing. Without the provision of the epitaxial regions 116, the upper surface would have seen increased erosion, degrading the CD and making subsequent processing more difficult.

FIG. 2F illustrates the product 100 after a plurality of processes was performed to complete fabrication of the vertical transistor devices 102. The hard mask 106 was removed. A gate structure including a gate insulation layer 121 (e.g., high-k dielectric, such as hafnium oxide) and a gate electrode 122 (e.g., one or more barrier, work function material, and/or metal layers) was formed around the channel region 120. An upper spacer 124 was formed. An upper SD region 126 (e.g., doped Si or SiGe) was epitaxially grown on the upper surface 116U of the epitaxial regions 116. Additional erosion of the epitaxial regions 116 may occur during the formation of the subsequent structures, but such erosion is not shown in FIG. 2F. The amount of erosion expected during the formation of the bottom spacer 118 and the subsequent gate layers may be factored into the process flow to determine an appropriate size of the epitaxial regions 116 to preserve the CD and provide a sufficient growth template for the upper S/D region 126.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
   forming a plurality of vertically oriented channel semiconductor structures above a substrate;
   forming a bottom source/drain (S/D) region proximate a lower portion of said vertically oriented channel semiconductor structure;
   forming a first dielectric layer above said vertically oriented channel semiconductor structure;
   reducing a thickness of said first dielectric layer to expose an upper portion of said vertically oriented channel semiconductor structure;
   forming a first semiconductor material region on said exposed upper portion, wherein said first semiconductor material comprises updoped semiconductor material;
   further reducing said thickness of said first dielectric layer after forming said first semiconductor material region to expose a channel portion of said vertically oriented channel semiconductor structure and to define a bottom spacer adjacent said bottom S/D region;
   forming a gate structure around said channel portion of said vertically oriented channel semiconductor structure; and
   forming a second semiconductor material region on said upper portion to define an upper S/D region after forming said gate structure.

2. The method of claim 1, wherein said undoped semiconductor material comprises undoped SiGe.

3. The method of claim 1, wherein said vertically oriented channel semiconductor structure comprise fins.

4. The method of claim 1, wherein a hard mask layer is formed above said upper portion of said vertically oriented channel semiconductor structure, and the method further comprises:
   forming said first dielectric layer above said hard mask layer;
   planarizing said first dielectric layer to expose said hard mask layer; and
   forming said first semiconductor material region on upper sidewall portions of said upper portion of said vertically oriented channel semiconductor structure.

\* \* \* \* \*